United States Patent
No et al.

(10) Patent No.: US 11,887,684 B2
(45) Date of Patent: Jan. 30, 2024

(54) STORAGE DEVICE INCLUDING NONVOLATILE MEMORY DEVICE, OPERATING METHOD OF STORAGE DEVICE, AND OPERATING METHOD OF ELECTRONIC DEVICE INCLUDING NONVOLATILE MEMORY DEVICE

(71) Applicant: Samsung Electronics Co., Ltd., Suwon-si (KR)

(72) Inventors: Haedong No, Hwaseong-si (KR); Youjin Jeon, Yongin-si (KR); Hyeji Yun, Hwaseong-si (KR); Jongtaek Seong, Hwaseong-si (KR); Jungeol Baek, Seoul (KR); Youn-Soo Cheon, Hwaseong-si (KR)

(73) Assignees: SAMSUNG ELECTRONICS CO., LTD., Suwon-si (KR); KOREA UNIVERSITY Research and Business Foundation, Seoul (KR)

( * ) Notice: Subject to any disclaimer, the term of this patent is extended or adjusted under 35 U.S.C. 154(b) by 136 days.

(21) Appl. No.: 17/488,989

(22) Filed: Sep. 29, 2021

(65) Prior Publication Data

US 2022/0139486 A1    May 5, 2022

(30) Foreign Application Priority Data

Oct. 30, 2020 (KR) .................. 10-2020-0143803
Jun. 16, 2021 (KR) .................. 10-2021-0078355

(51) Int. Cl.

| | | |
|---|---|---|
| G11C 16/26 | (2006.01) | |
| G11C 29/42 | (2006.01) | |
| G11C 29/44 | (2006.01) | |

(Continued)

(52) U.S. Cl.
CPC .............. *G11C 29/42* (2013.01); *G06N 20/00* (2019.01); *G11C 16/102* (2013.01); *G11C 16/26* (2013.01);
(Continued)

(58) Field of Classification Search
CPC ............ G11C 16/3459; G11C 16/3454; G11C 16/3436; G11C 16/34; G11C 16/0483;
(Continued)

(56) References Cited

U.S. PATENT DOCUMENTS 7,679,133 B2   3/2010   Son et al.
8,553,466 B2  10/2013   Han et al.
(Continued)

FOREIGN PATENT DOCUMENTS

KR    1020200114151 A    10/2020

OTHER PUBLICATIONS

J. Park, J.K. Lee, and H. Shin, Machine learning method to predict threshold voltage distribution by read disturbance in 3D NAND Flash Memories, Japanese Journal of Applied Physics, 2020, 59(8), 081003.

(Continued)

*Primary Examiner* — Alfredo Bermudez Lozada
(74) *Attorney, Agent, or Firm* — Muir Patent Law, PLLC

(57) ABSTRACT

A storage device includes a nonvolatile memory device and a memory controller. An operating method of the storage device includes sending, at the memory controller, a first read command and first offset information to the nonvolatile memory device, performing, at the nonvolatile memory device, first read operations based on the first read command and the first offset information, sending, at the nonvolatile memory device, a result of the first read operations as first data to the memory controller, sending, at the memory controller, a second read command, read voltage levels, and (Continued)

second offset information to the nonvolatile memory device, performing, at the nonvolatile memory device, second read operations based on the second read command, the read level information, and the second offset information, and sending, at the nonvolatile memory device, results of the second read operations as second data to the memory controller.

16 Claims, 12 Drawing Sheets

(51) Int. Cl.
*G11C 16/34* (2006.01)
*G06N 20/00* (2019.01)
*G11C 16/30* (2006.01)
*G11C 16/10* (2006.01)

(52) U.S. Cl.
CPC .......... *G11C 16/30* (2013.01); *G11C 16/3404* (2013.01); *G11C 16/3495* (2013.01); *G11C 29/4401* (2013.01)

(58) Field of Classification Search
CPC ............ G11C 16/3495; G11C 16/3404; G11C 16/30; G11C 16/26; G11C 16/102; G11C 29/42; G11C 29/4401
See application file for complete search history.

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 8,694,854 B1 | 4/2014 | Dar et al. | |
| 8,943,384 B2 | 1/2015 | Sridhara et al. | |
| 9,812,213 B2 | 11/2017 | Kim et al. | |
| 10,573,393 B1 | 2/2020 | Peng et al. | |
| 10,699,799 B2 | 6/2020 | Peng et al. | |
| 2011/0233648 A1 | 9/2011 | Seol et al. | |
| 2015/0085571 A1* | 3/2015 | Hu | G11C 11/5642 365/185.21 |
| 2020/0250030 A1 | 8/2020 | Sandell et al. | |
| 2020/0313693 A1 | 10/2020 | Jo et al. | |

OTHER PUBLICATIONS

J. Wang, T. Courtade, T. H. Shankar, and R. D. Wesel, Soft information for LDPC decoding in flash: Mutual-Information optimized quantization, 2011 IEEE Global Telecommunications Conference—GLOBECOM, Dec. 2011 (pp. 1-6) IEEE.

K. Kim, Technology for sub-50nm DRAM and NAND flash manufacturing, IEDM Tech. Dig., Dec. 2005, pp. 323-326.

K. Mizoguchi, T. Takahashi, S. Aritome, and K. Takeuchi, Data-retention characteristics comparison of 2D and 3D TLC NAND flash memories, 2017 IEEE International Memory Workshop (IMW), May 2017, (pp. 1-4). IEEE.

K. Zhao, W. Zhao, H. Sun, X. Zhang, N. Zheng, and T. Zhang, LDPC-in-SSD: Making advanced error correction codes work effectively in solid state drives., Presented as part of the 11th {USENIX} Conference on File and Storage Technologies ({FAST} 13), 2013, pp. 243-256.

Y. Cai, E. F. Haratsch, O. Mutlu, and K. Mai, Threshold voltage distribution in MLC NAND flash memory: Characterization, analysis, and modeling, 2013 Design, Automation & Test in Europe Conference & Exhibition, Mar. 2013, (pp. 1285-1290). IEEE.

\* cited by examiner

STORAGE DEVICE INCLUDING NONVOLATILE MEMORY DEVICE, OPERATING METHOD OF STORAGE DEVICE, AND OPERATING METHOD OF ELECTRONIC DEVICE INCLUDING NONVOLATILE MEMORY DEVICE

CROSS-REFERENCE TO RELATED APPLICATIONS

This application claims priority under 35 U.S.C. § 119 to Korean Patent Application Nos. 10-2020-0143803 filed on Oct. 30, 2020 and 10-2021-0078355 filed on Jun. 16, 2021, in the Korean Intellectual Property Office, the disclosures of which are incorporated by reference herein in their entireties.

BACKGROUND

Embodiments of the present disclosure described herein relate to a semiconductor device, and more particularly, relate to a storage device including a nonvolatile memory device with an improved operating speed and improved reliability, an operating method of the storage device, and an operating method of an electronic device including the nonvolatile memory device.

Nonvolatile memory devices may retain data stored therein even when a power is not supplied. Nonvolatile memory devices may include a flash memory device, a phase change memory device, a magnetic memory device, a ferroelectric memory device, a resistive memory device, etc.

As a time passes after data are stored in the nonvolatile memory device, as read operations are performed, or as a stress is applied from the outside, an error may occur at data stored in the nonvolatile memory device. In particular, as the nonvolatile memory device is manufactured in a three-dimensional structure and as the number of bits stored in each memory cell increases, error factors and types may be diversified.

To correct an error of data stored in the nonvolatile memory device, error correction may be performed when the data are read from the nonvolatile memory device. However, as the error factors and types are diversified, factors to be considered in error correction may be diversified, thereby causing an increase in a time necessary for error correction.

SUMMARY

Embodiments of the present disclosure provide a storage device including a nonvolatile memory device performing error correction at an improved speed and improving reliability, an operating method of the storage device, and an operating method of an electronic device including the nonvolatile memory device.

According to an embodiment, an operating method of a storage device which includes a nonvolatile memory device and a memory controller includes sending, at the memory controller, a first read command and first offset information to the nonvolatile memory device, performing, at the nonvolatile memory device, first read operations based on the first read command and the first offset information, sending, at the nonvolatile memory device, a result of the first read operations as first data to the memory controller, sending, at the memory controller, a second read command, read voltage levels, and second offset information to the nonvolatile memory device, performing, at the nonvolatile memory device, second read operations based on the second read command, the read voltage levels, and the second offset information, and sending, at the nonvolatile memory device, results of the second read operations as second data to the memory controller.

According to an embodiment, a storage device includes a nonvolatile memory device including a plurality of memory cells, and a memory controller that sends a first read command and first offset information to the nonvolatile memory device, receives first data from the nonvolatile memory device in response to the first read command and the first offset information, generates read voltage levels based on the first data, sends a second read command, the read voltage levels, and second offset information to the nonvolatile memory device, and receives second data from the nonvolatile memory device in response to the second read command, the read voltage levels, and the second offset information.

According to an embodiment, an operating method of an electronic device which includes a plurality of nonvolatile memory devices includes performing read operations on the plurality of nonvolatile memory devices to detect a distribution state of threshold voltages of memory cells of each of the nonvolatile memory devices, selecting a value of a strong error ratio (SER) and/or a value of a strong correct ratio (SCR) based on results of the read operations, obtaining offset values corresponding to the value of the SER and/or the value of the SCR from the distribution state of the threshold voltages of the memory cells, and generating an offset prediction module by performing machine learning based on characteristics of the plurality of nonvolatile memory devices, addresses of the read operations, and the offset values.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure may be described in detail and clearly to such an extent that an ordinary one in the art easily implements the disclosure.

Figure 1:
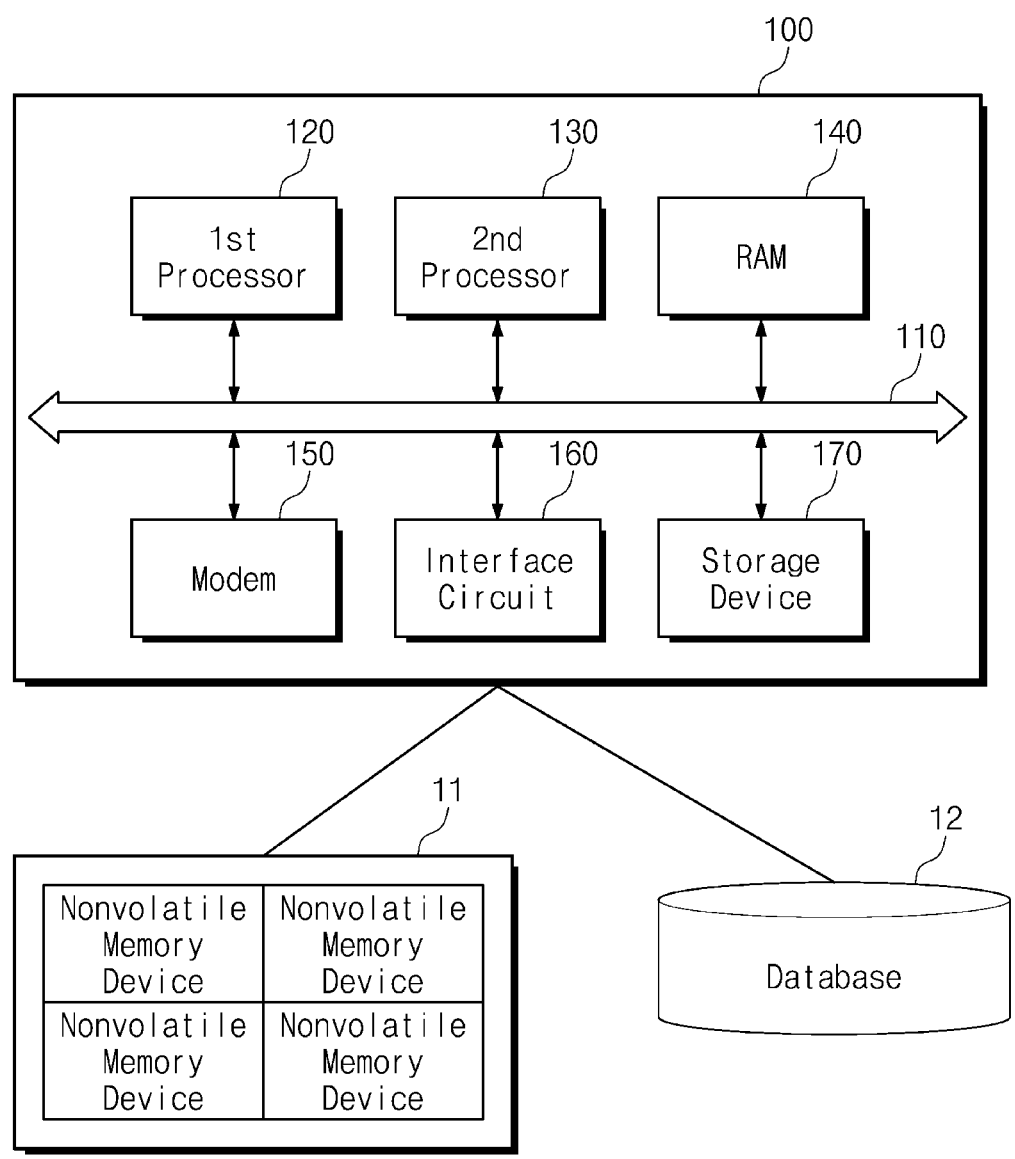
FIG. 1 illustrates an electronic device according to an embodiment of the present disclosure.

FIG. 1 illustrates an electronic device 10 according to an embodiment of the present disclosure. Referring to FIG. 1, the electronic device 10 may include nonvolatile memory devices 11, a database 12, and a computing device 100.

The nonvolatile memory devices 11 may be directly connected to the computing device 100, or the nonvolatile memory devices 11 may be implemented with storage devices combined with a memory controller and may be connected to the computing device 100 through the memory controller.

The computing device 100 may perform read operations on the nonvolatile memory devices 11 to obtain a dataset for machine learning. The computing device 100 may store the obtained dataset in the database 12.

The computing device 100 includes a bus 110, a first processor 120, a second processor 130, a random access memory (RAM) 140, a modem 150, an interface circuit 160, and a storage device 170.

The bus 110 may provide channels between the components of the computing device 100. The first processor 120 may include a central processing unit (CPU) that drives an operating system of the computing device 100 and executes various applications. The second processor 130 may include an auxiliary processor that is configured to perform tasks delegated from the first processor 120 to support the first processor 120. For example, the second processor 130 may include a graphics processing unit (GPU), a neural processing unit (NPU), a neuromorphic processor, etc.

The RAM 140 may be used as a main memory of the computing device 100. The RAM 140 may store various codes executable by the first processor 120 or the second processor 130, and various data processed or to be processed by the first processor 120 or the second processor 130. The RAM 140 may include a dynamic RAM (DRAM), a static RAM (SRAM), a storage class memory (SCM), a phase change RAM (PRAM), a magnetic RAM (MRAM), a ferroelectric RAM (FRAM), a resistive RAM (RRAM), etc.

The modem 150 may perform wired or wireless communication with an external device. The modem 150 may include various modulators and demodulators that are defined by various communication protocols.

The interface circuit 160 may include circuits that are configured to communicate with an external device. For example, the interface circuit 160 may communicate with the nonvolatile memory devices 11 and the database 12. The interface circuit 160 may include circuits that are configured to communicate with a user. The interface circuit 160 may include user input interface circuits and user output interface circuits.

The storage device 170 may be used as an auxiliary storage device of the computing device 100. The storage device 170 may store original codes of an operating system and applications that are executable by the first processor 120. The storage device 170 may store original data that are processed by the first processor 120 and the second processor 130. The storage device 170 may store data that are generated or updated by the first processor 120 and the second processor 130.

Figure 2:
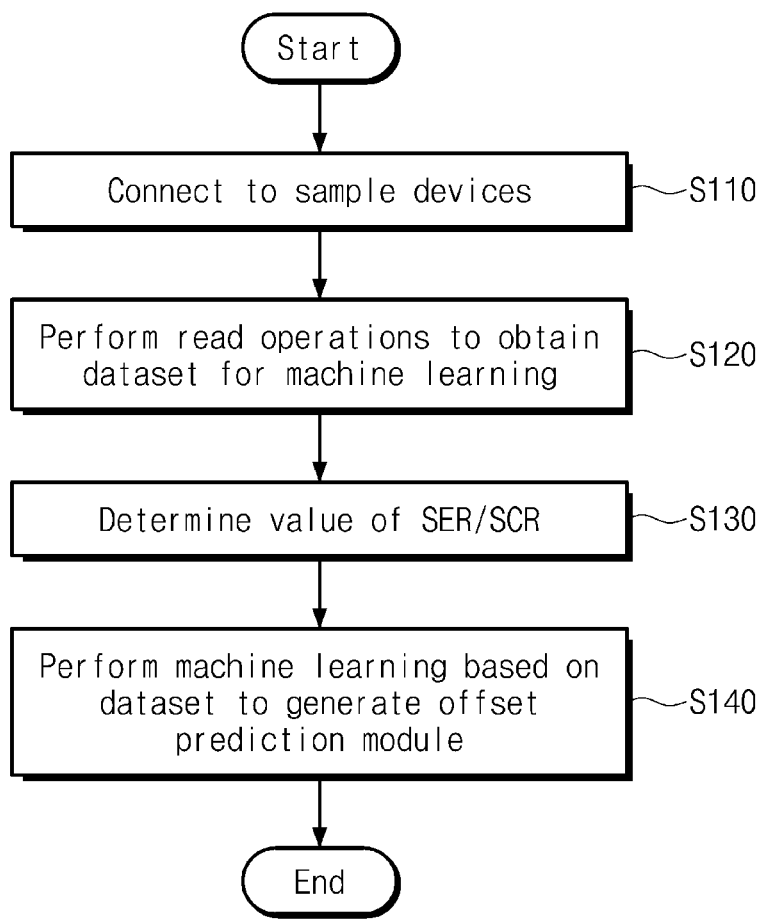
FIG. 2 illustrates an example of an operating method of an electronic device of FIG. 1 according to example embodiments.

FIG. 2 illustrates an example of an operating method of the electronic device 10 of FIG. 1 according to example embodiments. Referring to FIGS. 1 and 2, in operation S110, the computing device 100 may be connected to sample devices, for example, nonvolatile memory devices 11.

For example, the nonvolatile memory devices 11 may have the same data storage characteristics or different data storage characteristics. The data storage characteristics may include the number of program and erase cycles associated with memory cells of each nonvolatile memory device, a time that passes (or left alone) after data are written in the memory cells of each nonvolatile memory device, a temperature at which each nonvolatile memory device is left alone, the number of read operations performed after data are written in the memory cells of each nonvolatile memory device, etc.

In operation S120, the computing device 100 may perform read operations on the nonvolatile memory devices 11 to obtain a dataset for machine learning. The obtained dataset may be stored in the database 12. The dataset may include physical features of a read operation and information about the physical features. The dataset may include information about a distribution state of threshold voltages of memory cells.

In operation S130, the computing device 100 may determine a value of a strong error ratio (SER) and a value of a strong correct ratio (SCR) based on the dataset. The SER and SCR may be associated with read levels for soft decision and may be determined based on a characteristic of an error correction decoder to be applied to the nonvolatile memory devices 11. For example, a value of the SER or a value of the SCR may be determined as values at which an error correction decoder to be applied to the nonvolatile memory devices 11 has the highest correction ratio. Herein, for convenience of description, the terms of the "read level" and "read voltage level," may be used interchangeably.

When the value of the SER or the value of the SCR is determined, an offset corresponding to the determined SER value or the determined SCR value may be drawn based on the information about the distribution state of the threshold voltages of the memory cells included in the dataset. For example, the dataset may include information about the data storage characteristics, the physical features of the read operation, and the offset according to the SER value or the SCR value.

In operation S140, the computing device 100 may perform machine learning based on the dataset stored in the database 12 and thus may generate a machine learning-based offset prediction module. The machine learning-based offset prediction module may be learned to output offset information when physical features of the read operation are input thereto.

For example, the offset prediction module may be learned based on random forest (RF), multi-layer perception (MLP), or linear regression (LR). The random forest may include an ensemble model of a decision tree based on entropy. The multi-layer perception may use at least two hidden layers and may use a hyperbolic tangent (tanh) as an activation function.

Figure 3:
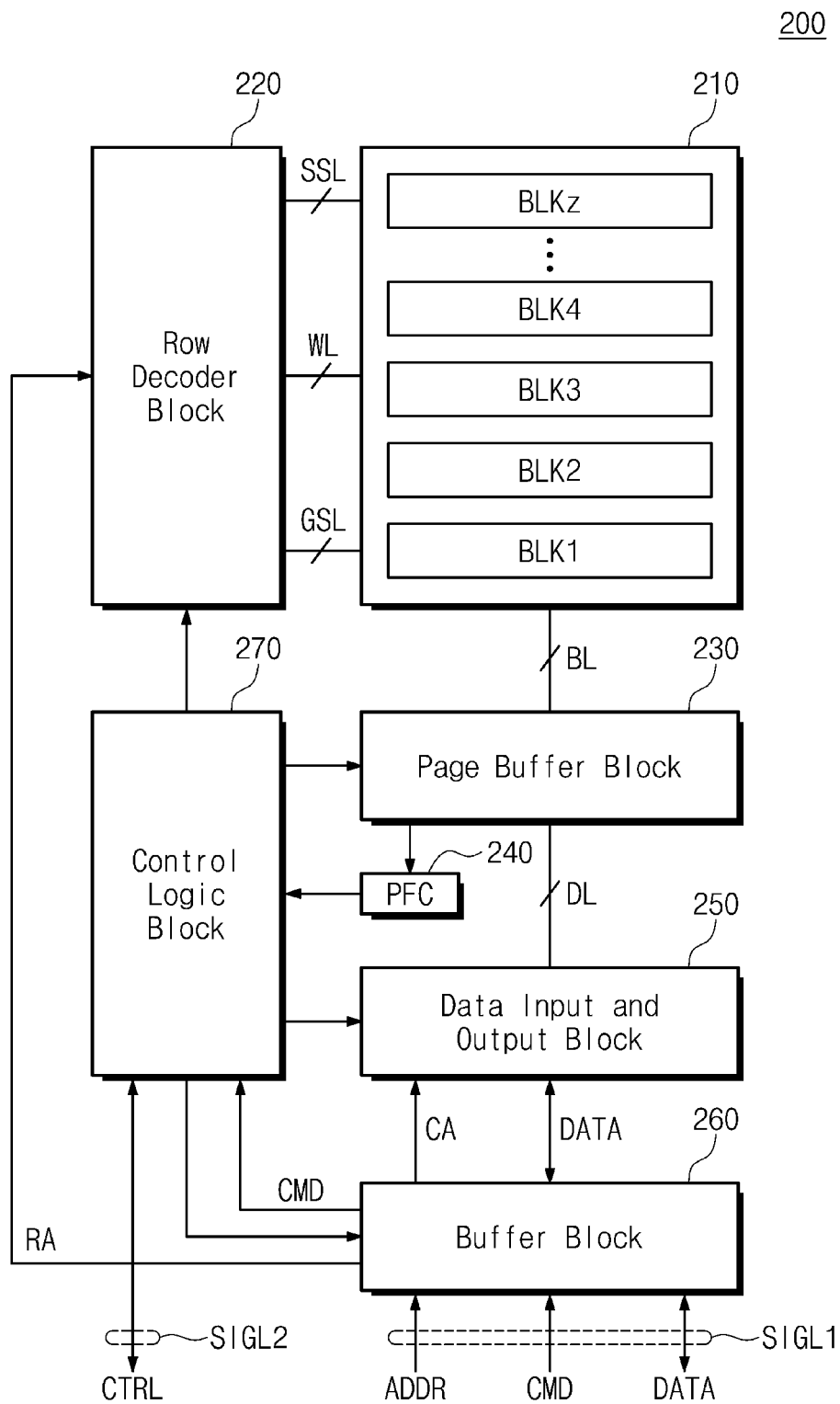
FIG. 3 is a block diagram illustrating a nonvolatile memory device according to an embodiment of the present disclosure.

FIG. 3 is a block diagram illustrating a nonvolatile memory device 200 according to an embodiment of the present disclosure. In an embodiment, the nonvolatile memory device 200 may correspond to each of the nonvolatile memory devices 11 of FIG. 1

Referring to FIG. 3, the nonvolatile memory device 200 includes a memory cell array 210, a row decoder block 220, a page buffer block 230, a pass/fail check block (PFC) 240, a data input and output block 250, a buffer block 260, and a control logic block 270.

The memory cell array 210 includes a plurality of memory blocks BLK1 to BLKz. Each of the memory blocks BLK1 to BLKz includes a plurality of memory cells. Each of the memory blocks BLK1 to BLKz may be connected to the row decoder block 220 through one or more ground selection lines GSL, word lines WL, and one or more string selection lines SSL. Some of the word lines WL may be used as dummy word lines. Each of the memory blocks BLK1 to BLKz may be connected to the page buffer block 230 through a plurality of bit lines BL. The plurality of memory blocks BLK1 to BLKz may be connected in common with the plurality of bit lines BL.

In an embodiment, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of the erase operation.

The row decoder block 220 is connected to the memory cell array 210 through the ground selection lines GSL, the word lines WL, and the string selection lines SSL. The row decoder block 220 operates under control of the control logic block 270.

The row decoder block 220 may decode a row address RA received from the buffer block 260 and may control voltages to be applied to the string selection lines SSL, the word lines WL, and the ground selection lines GSL based on the decoded row address.

The page buffer block 230 is connected to the memory cell array 210 through the plurality of bit lines BL. The page buffer block 230 is connected to the data input and output block 250 through a plurality of data lines DL. The page buffer block 230 operates under control of the control logic block 270.

In a program operation, the page buffer block 230 may store data to be written in memory cells. The page buffer block 230 may apply voltages to the plurality of bit lines BL based on the stored data. In a read operation or in a verify read operation that is performed in the program operation or the erase operation, the page buffer block 230 may sense voltages of the bit lines BL and may store a sensing result.

In the verify read operation associated with the program operation or the erase operation, the pass/fail check block 240 may verify the sensing result of the page buffer block 230. For example, in the verify read operation associated with the program operation, the pass/fail check block 240 may count the number of values (e.g., the number of 0s) respectively corresponding to on-cells that are not programmed to a target threshold voltage or more.

In the verify read operation associated with the erase operation, the pass/fail check block 240 may count the number of values (e.g., the number of 1s) respectively corresponding to off-cells that are not erased to a target threshold voltage or less. When a counting result is a threshold value or more, the pass/fail check block 240 may output a signal indicating a failure to the control logic block 270. When the counting result is smaller than the threshold value, the pass/fail check block 240 may output a signal indicating a pass to the control logic block 270. Depending on a verification result of the pass/fail check block 240, a program loop of the program operation may be further performed, or an erase loop of the erase operation may be further performed.

The data input and output block 250 is connected to the page buffer block 230 through the plurality of data lines DL. The data input and output block 250 may receive a column address CA from the buffer block 260. The data input and output block 250 may output data read by the page buffer block 230 to the buffer block 260 depending on the column address CA. The data input and output block 250 may provide data received from the buffer block 260 to the page buffer block 230, based on the column address CA.

Through first signal lines SIGL1, the buffer block 260 may receive a command CMD and an address ADDR from an external device and may exchange data "DATA" with the external device. The buffer block 260 may operate under control of the control logic block 270. The buffer block 260 may provide the command CMD to the control logic block 270. The buffer block 260 may provide the row address RA of the address ADDR to the row decoder block 220 and may provide the column address CA of the address ADDR to the data input and output block 250. The buffer block 260 may exchange the data "DATA" with the data input and output block 250.

The control logic block 270 may exchange control signals CTRL with the external device through second signal lines SIGL2. The control logic block 270 may allow the buffer block 260 to route the command CMD, the address ADDR, and the data "DATA". The control logic block 270 may decode the command CMD received from the buffer block 260 and may control the nonvolatile memory device 200 based on the decoded command.

In an embodiment, the nonvolatile memory device 200 may be manufactured in a bonding manner. The memory cell array 210 may be manufactured at a first wafer, and the row decoder block 220, the page buffer block 230, the data input and output block 250, the buffer block 260, and the control logic block 270 may be manufactured at a second wafer. The nonvolatile memory device 200 may be implemented by coupling the first wafer and the second wafer such that an upper surface of the first wafer and an upper surface of the second wafer face each other.

For another example, the nonvolatile memory device 200 may be manufactured in a cell over peri (COP) manner. A peripheral circuit including the row decoder block 220, the page buffer block 230, the data input and output block 250, the buffer block 260, and the control logic block 270 may be implemented on a substrate. The memory cell array 210 may be implemented over the peripheral circuit. The peripheral circuit and the memory cell array 210 may be connected by using through vias.

Figure 4:
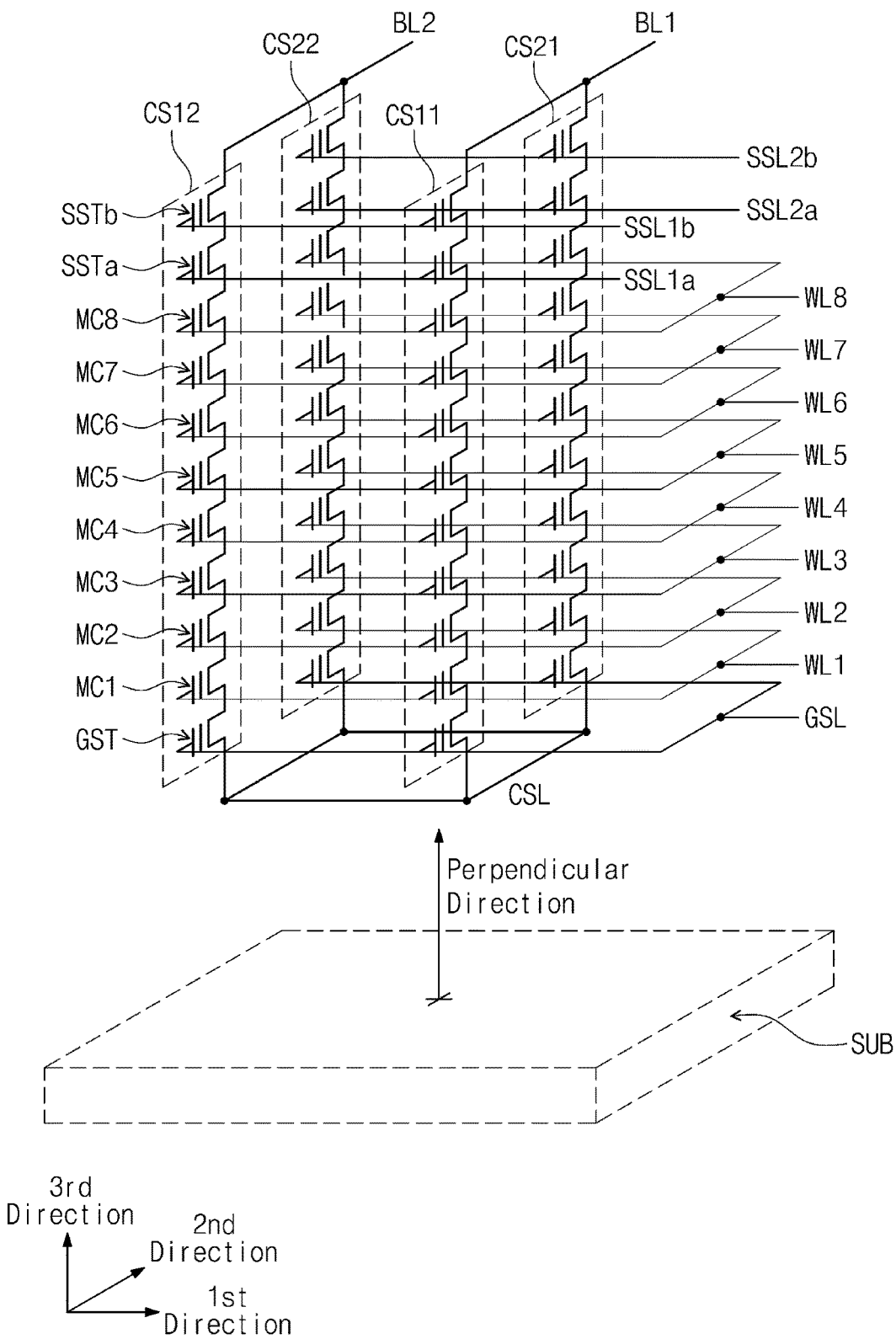
FIG. 4 is a circuit diagram illustrating an example of one memory block of memory blocks of FIG. 3.

FIG. 4 is a circuit diagram of an example of one memory block BLKa of the memory blocks BLK1 to BLKz of FIG. 3. Referring to FIG. 4, a plurality of cell strings CS11, CS12, CS21 and CS22 may be arranged on a substrate SUB in a first direction (e.g., a row direction) and a second direction (e.g., a column direction). Each row may be extended in a first direction. Each column may be extended in a second direction. The plurality of cell strings CS11, CS12, CS21 and CS22 may be connected in common to a common source line CSL formed on (or in) a substrate SUB. In FIG. 4, a location of the substrate SUB is depicted by way of example for better understanding of a structure of the memory block BLKa.

Cell strings of each row may be connected in common with the ground selection line GSL and with corresponding string selection lines of first and second string selection lines SSL1a, SSL1b, SSL2a and SSL2b. Cell strings of each column may be connected to a corresponding bit line of first and second bit lines BL1 and BL2. Cell strings placed at the same column from among the plurality of cell strings CS11, CS12, CS21, and CS22 may be connected to the same bit line. For example, the cell strings CS11 and CS21 may be connected to the first bit line BL1, and the cell strings CS12 and CS22 may be connected to the second bit line BL2. Each of the plurality of cell strings CS11, CS12, CS21, and CS22 may include a plurality of cell transistors. Each of the plurality of cell transistors may include a charge trap flash (CTF) memory cell, but the present disclosure is not limited thereto. The plurality of cell transistors may be stacked in a height direction that is a direction perpendicular to a plane defined by the row direction and the column direction (e.g., the substrate (not illustrated)).

Each cell string may include at least one ground selection transistor GST connected to the ground selection line GSL, and a plurality of memory cells MC1 to MC8 respectively connected to a plurality of word lines WL1 to WL8. Cell strings of a first row may further include string selection transistors SSTa and SSTb connected to first string selection lines SSL1a and SSL1b. Cell strings of a second row may further include string selection transistors SSTa and SSTb connected with first string selection lines SSL2a and SSL2b.

In each cell string, the ground selection transistor GST, the memory cells MC1 to MC8, and the string selection transistors SSTa and SSTb may be connected in series in a direction perpendicular to the substrate SUB, for example, a third direction and may be sequentially stacked in the direction perpendicular to the substrate SUB. In each cell string, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell. For example, dummy memory cells may be simultaneously formed with normal memory cells with the same processes. A dummy memory cell may be activated by a dummy word line, but may not have any "data" stored to read from a device external. For instance, data stored in a dummy memory cell electrically connected to a dummy word line may not be transmitted outside of the memory cell array 210 through selection signals provided by the page buffer block 230, as is the case for normal memory cells (e.g., memory cells MC1 to MC8 other than the dummy memory cell). For instance, a dummy memory cell electrically connected to a dummy word line may not have any connection to a bit line to transmit data there between as with normal memory cells.

In an embodiment, memory cells that are located at the same height and are associated with one string selection line SSL1a, SSL1b, SSL2a and SSL2b may form one physical page. Memory cells of one physical page may be connected to one sub-word line. Sub-word lines of physical pages located at the same height may be connected in common to one word line.

Figure 5:
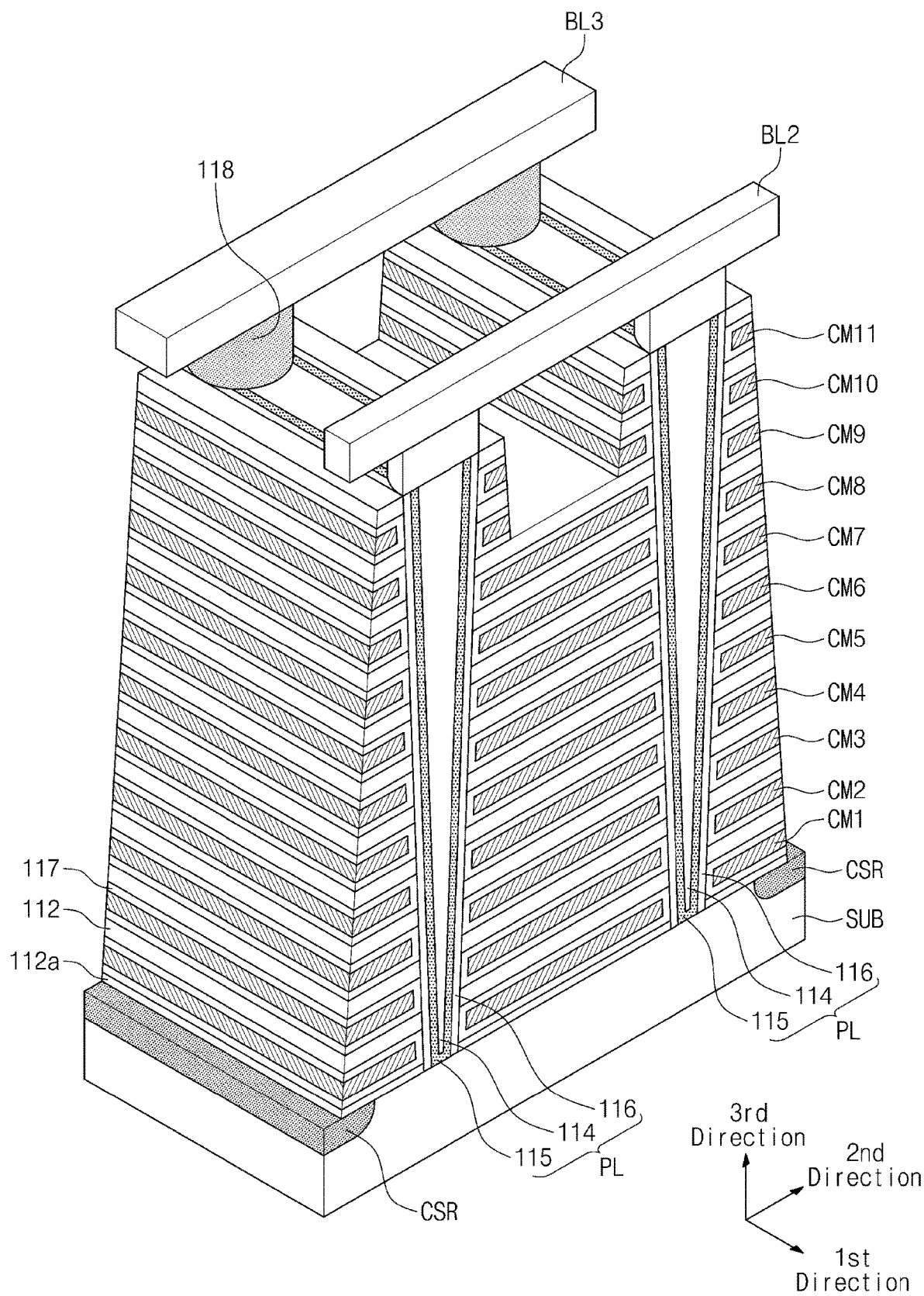
FIG. 5 is a perspective view illustrating a partial structure of a memory block of FIG. 3.

FIG. 5 is a perspective view of a partial structure of the memory block BLKa of FIG. 4. Referring to FIGS. 3, 4, and 5, common source regions CSR that are extended in the first direction and are spaced from each other in the second direction are provided on the substrate SUB.

The common source regions CSR may be connected in common to form the common source line CSL. In an embodiment, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate SUB in the third direction perpendicular to the substrate SUB. The insulating layers 112 and 112a may be spaced from each other in the third direction.

In an embodiment, the insulating layers 112 and 112a may include silicon oxide or silicon nitride. In an embodiment, the thickness of the insulating layer 112a (e.g., a thicknesses of the insulating layer 112a in the third direction), which is in contact with the substrate SUB, from among the insulating layers 112 and 112a may be thinner than the thicknesses of each of the remaining insulating layers 112 (e.g., a thickness of each insulating layer in the third direction).

A plurality of pillars PL that are disposed to be spaced from each other in the first direction and the second direction and penetrate the insulating layers 112 and 112a in the third direction are provided between the common source regions CSR. In an embodiment, the pillars PL may be in contact with the substrate SUB through the insulating layers 112 and 112a. Each of the pillars PL may include an inner material 114, a channel layer 115, and a first insulating layer 116.

The inner material 114 may include an insulating material or an air gap. The term "air" as discussed herein, may refer to atmospheric air, or other gases that may be present during the manufacturing process of the nonvolatile memory device 200. It should be appreciated that an "air gap" may comprise a gap having air or other gases (e.g., such as those present during manufacturing the nonvolatile memory device 200) or may comprise a gap forming a vacuum therein. The channel layer 115 may include a P-type semiconductor material or an intrinsic semiconductor material. The first insulating layer 116 may include one or more of insulating layers (e.g., different insulating layers) such as a silicon oxide layer, a silicon nitride layer, and an alumina oxide layer.

Between the common source regions CSR, second insulating layers 117 are provided on upper surfaces and lower surfaces of the insulating layers 112 and 112a and on exposed outer surfaces of the pillars PL. There may be removed the second insulating layers 117 provided on an upper surface of the uppermost insulating layer among the insulating layers 112 and 112a.

In each of the pillars PL, the first insulating layer 116 and the second insulating layer 117 may form an information storage layer when coupled adjacent to each other. For example, the first insulating layer 116 and the second insulating layer 117 may include oxide-nitride-oxide (ONO) or oxide-nitride-alumina (ONA). The first insulating layer 116 and the second insulating layer 117 may form a tunneling insulating layer, a charge trap layer, and a blocking insulating layer.

Between the common source regions CSR and between the insulating layers 112 and 112a, conductive materials CM1 to CM11 are provided on exposed outer surfaces of the second insulating layers 117. The conductive materials CM1 to CM11 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers of the pillars PL.

Bit lines BL2 and BL3 that are extended in the second direction and are spaced from each other in the first direction are provided on the drains 118. The bit lines BL2 and BL3 are connected to the drains 118. In an embodiment, the drains 118 and bit lines (e.g., BL2 and BL3) may be connected through contact plugs. The bit lines BL2 and BL3 may include a metallic conductive material.

The pillars PL form the cell strings CS11, CS12, CS21 and CS22 together with the first and second insulating layers 116 and 117 and the conductive materials CM1 to CM11. Each of the pillars PL forms a cell string together with the first and second insulating layers 116 and 117 and the conductive materials CM1 to CM11, which are adjacent thereto. The first conductive material CM1 may form the ground selection transistors GST together with the first and second insulating layers 116 and 117 and the channel layers 115 adjacent thereto. The first conductive material CM1 may be extended in the first direction to form the ground selection line GSL.

The second to ninth conductive materials CM2 to CM9 may form first to eighth memory cells MC1 to MC8 together with the first and second insulating layers 116 and 117 and the channel layers 115, which are adjacent thereto. The second to ninth conductive materials CM2 to CM9 may be extended in the first direction to form first to eighth word lines WL1 to WL8, respectively.

The tenth conductive materials CM10 may form the string selection transistors SSTa together with the first and second insulating layers 116 and 117 and the channel layers 115, which are adjacent thereto. The tenth conductive materials CM10 may be extended in the first direction to form the string selection lines SSL1*a* and SSL2*a*.

The eleventh conductive materials CM11 may form the string selection transistors SSTb together with the first and second insulating layers 116 and 117 and the channel layers 115, which are adjacent thereto. The eleventh conductive materials CM11 may be extended in the first direction to form the string selection lines SSL1*b* and SSL2*b*.

As the first to eleventh conductive materials CM1 to CM11 are stacked in the third direction, in each cell string, the ground selection transistor GST, the memory cells MC1 to MC8, and the string selection transistors SSTa and SSTb may be stacked in the third direction.

As the channel layer 115 is shared by the first to eleventh conductive materials CM1 to CM11 in each of the pillars PL, in each cell string, the ground selection transistor GST, the memory cells MC1 to MC8, and the string selection transistors SSTa and SSTb may be serially connected in the third direction. For example, the shared channel layer 115 may form a vertical body.

As the first to ninth conductive materials CM1 to CM9 are connected in common, the ground selection line GSL and the first to eighth word lines WL1 to WL8 may be regarded as being connected in common in the cell strings CS.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuitry associated with the operation of the memory cells MC may be located above or within a substrate. The term "monolithic" means that layers of each level of the array are directly deposited on the layers of each underlying level of the 3D memory array.

In an embodiment of the present disclosure, the 3D memory array includes vertical cell strings CS11, CS12, CS21 and CS22 (or NAND strings) that are vertically oriented such that at least one memory cell is located over another memory cell. The at least one memory cell may include a charge trap layer. Each cell string further includes at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Figure 6:
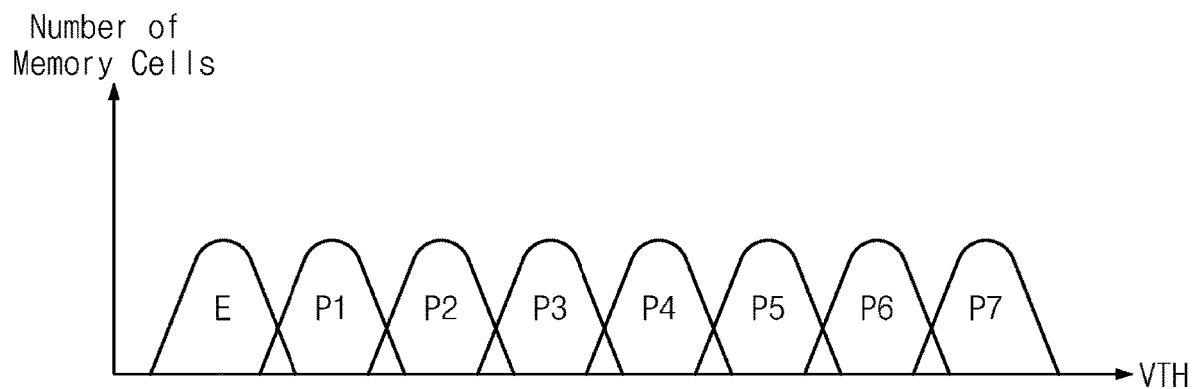
FIG. 6 illustrates an example in which data are programmed in memory cells.

FIG. 6 illustrates an example in which data are programmed in memory cells MC. Referring to FIGS. 3, 4, 5, and 6, an example in which three bits are programmed in each memory cell MC is illustrated. In FIG. 6, a horizontal axis represents a threshold voltage VTH of the memory cells MC, and a vertical axis represents the number of memory cells MC. In an embodiment, the memory cell MC may correspond to the first to eighth memory cells MC1 to MC8.

Each memory cell MC in which three bits are programmed may have a threshold voltage corresponding to one of an erase state "E", a first program state P1, a second program state P2, a third program state P3, a fourth program state P4, a fifth program state P5, a sixth program state P6, and a seventh program state P7.

Data of a memory cell belonging to a region where voltage ranges of two or more states overlap each other may be read as an error in the read operation. Threshold voltage ranges of the states of the memory cells MC may change depending on a data storage characteristic of the nonvolatile memory device 200. For example, the aspect that an error occurs in the nonvolatile memory device 200 may change depending on the data storage characteristic of the nonvolatile memory device 200.

As described with reference to FIGS. 4, 5, and 6, the aspect that errors occur may change depending on physical features, which are associated with the read operation, such as an address and a data storage characteristic. Parameters for increasing the accuracy of error correction, for example, values or offsets of voltages or currents to be applied to memory cells may change depending on physical features.

To figure out the values or offsets of the voltages or currents capable of increasing the accuracy of error correction when an error occurs may require an additional time and may delay a time to access the nonvolatile memory device 200.

As described with reference to FIG. 2, the electronic device 10 according to an embodiment of the present disclosure may perform read operations on the nonvolatile memory devices 11 to collect a dataset of physical features and offsets according to the physical features. Also, the electronic device 10 may perform machine learning based on the collected dataset and thus may generate an offset prediction module that outputs appropriate offset information when physical features associated with memory cells where an error occurs are input thereto. Appropriate offset information may be drawn without an additional time for figuring out offsets, and thus, the reliability and speed about error correction of the nonvolatile memory device 200 may be improved.

Figure 7:
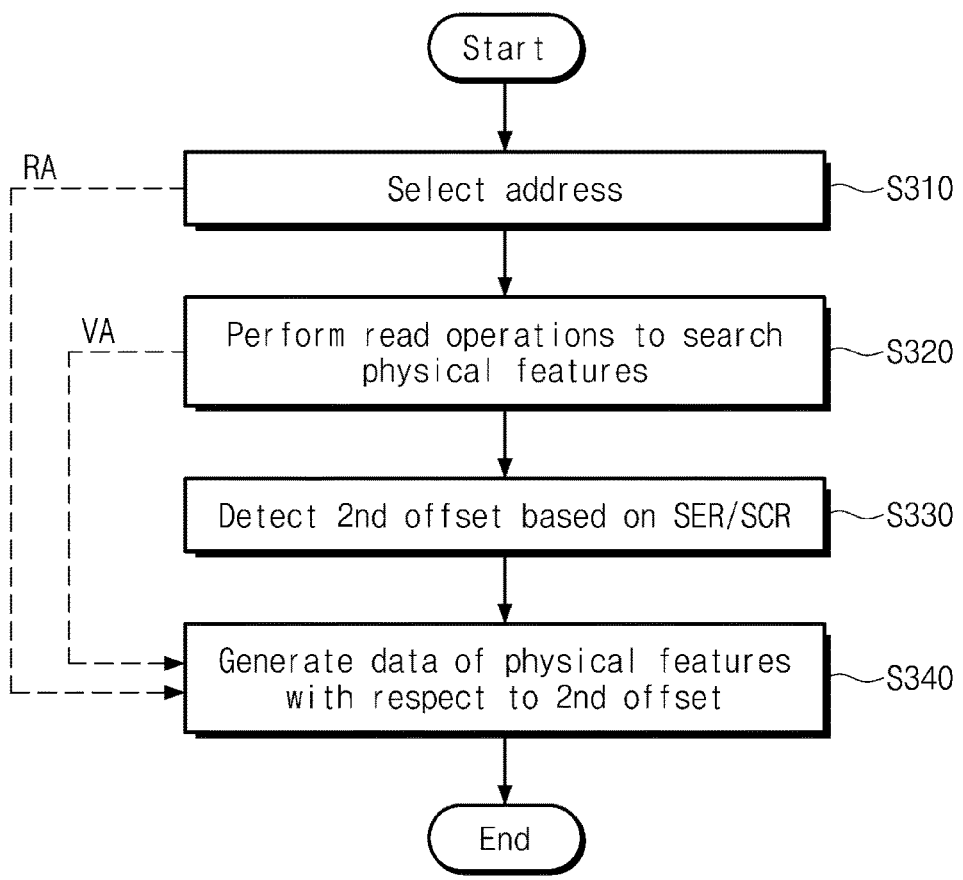
FIG. 7 illustrates an example of a process in which an electronic device generates a dataset according to example embodiments.

FIG. 7 illustrates an example of a process in which the electronic device 10 generates a dataset according to example embodiments. Referring to FIGS. 1 and 7, in operation S310, the computing device 100 may select an address of each of the nonvolatile memory devices 11. The computing device 100 may select an address of each of the nonvolatile memory devices 11, sequentially, randomly, or based on a given algorithm. The row address RA of the address of each of the nonvolatile memory devices 11 may be included in physical features.

In operation S320, the computing device 100 may respectively perform read operations on the nonvolatile memory devices 11 to detect information about a distribution state of threshold voltages of memory cells of each of the nonvolatile memory devices 11. The information of the distribution state of the threshold voltages may include information of a valley. A valley may correspond to the center of a region where two adjacent threshold voltage distributions overlap each other, in the threshold voltage distribution diagram illustrated in FIG. 6. The computing device 100 may calculate a region value VA based on a result of the read operations. The valley information and the region value VA may be included in the physical features. For example, the region value VA may include a distribution state of threshold voltages of memory cells. The region value VA may include a number of memory cells of each (or at least one) region defined by two adjacent read voltage levels. The at least one region may correspond to the valley.

In operation S330, the computing device 100 may detect a second offset corresponding to a value of the SER and a value of the SCR, based on the value of the SER or the value of the SCR. For example, the computing device 100 may detect the second offset corresponding to a given SER value or a given SCR value. Alternatively, the computing device 100 may detect second offsets corresponding to different SER values or different SCR values.

In operation S340, the computing device 100 may generate data of physical features associated with the second offset as a portion of the dataset. The computing device 100 may repeatedly perform operation S310 and operation S340 on different physical features (e.g., different addresses or different data storage characteristics) and thus may generate the dataset.

Figure 8:
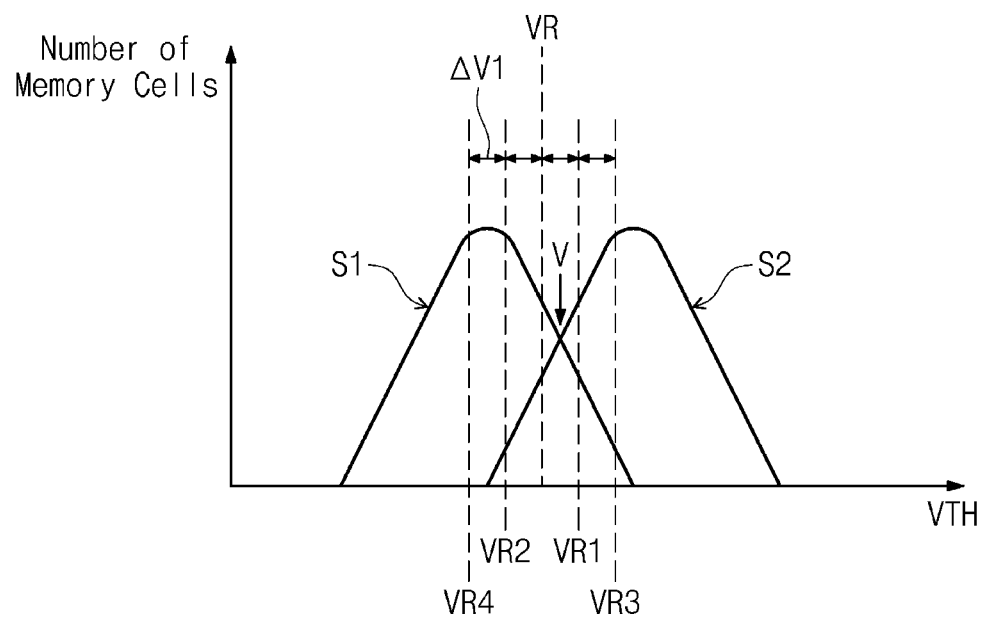
FIG. 8 illustrates an example of performing first read operations on each of nonvolatile memory devices according to example embodiments.

FIG. 8 illustrates an example of performing first read operations on each of the nonvolatile memory devices 11 according to example embodiments. Referring to FIGS. 1, 7, and 8, the first read operations may include a read operation using a standard read level (or a standard read voltage level) VR defined between two adjacent states (e.g., first and second states S1 and S2), a read operation using a first read level VR1 higher than the standard read level VR as much as a first offset (e.g., ΔV1), and a read operation using a second read level VR2 lower than the standard read level VR as much as the first offset.

Also, the first read operations may further include a read operation using a third read level VR3 higher than the first read level VR1 as much as the first offset, and a read operation using a fourth read level VR4 lower than the second read level VR3 as much as the first offset.

In the first read operations, the computing device 100 may calculate region values VA (or the numbers of memory cells thereof) as a physical feature. For example, the computing device 100 may calculate the number of memory cells having threshold voltages between the standard read level VR and the first read level VR1 as physical features.

The computing device 100 may calculate the number of memory cells having threshold voltages between the standard read level VR and the second read level VR2 as physical features. The computing device 100 may calculate the number of memory cells having threshold voltages between the first read level VR1 and the third read level VR3 as physical features. The computing device 100 may calculate the number of memory cells having threshold voltages between the second read level VR2 and the fourth read level VR4 as physical features.

The computing device 100 may calculate the number of memory cells having threshold voltages higher than the third read level VR3 as physical features. The computing device 100 may calculate the number of memory cells having threshold voltages lower than the fourth read level VR4 as physical features.

The computing device 100 may calculate a level of a valley "V", based on read results of at least three of the standard read level VR, the first read level VR1, the second read level VR2, the third read level VR3, and the fourth read level VR4. The valley "V" may correspond to a level at which lines corresponding to two adjacent states cross each other.

In an embodiment, the computing device 100 may perform the read operations, which are described with reference to FIG. 8, with respect to the following pairs of two adjacent states: the erase state "E" and the first program state P1, the first program state P1 and the second program state P2, the second program state P2 and the third program state P3, the third program state P3 and the fourth program state P4, the fourth program state P4 and the fifth program state P5, the fifth program state P5 and the sixth program state P6, and the sixth program state P6 and the seventh program state P7.

For example, the computing device 100 may perform the first read operations on all the standard read levels between respective two adjacent states of each of the nonvolatile memory devices 11 and may calculate the valley "V" and the region values.

For another example, the computing device 100 may perform the read operations, which are described with reference to FIG. 8, with respect to at least one of the following pairs of two adjacent states: the erase state "E" and the first program state P1, the first program state P1 and the second program state P2, the second program state P2 and the third program state P3, the third program state P3 and the fourth program state P4, the fourth program state P4 and the fifth program state P5, the fifth program state P5 and the sixth program state P6, and the sixth program state P6 and the seventh program state P7.

For example, the computing device 100 may perform the first read operations, which are described with reference to FIG. 8, with respect to a pair of adjacent program states P6 and P7 in which a change of threshold voltages is the greatest depending on a data storage characteristic and may calculate the valley "V" and region values.

Figure 9:
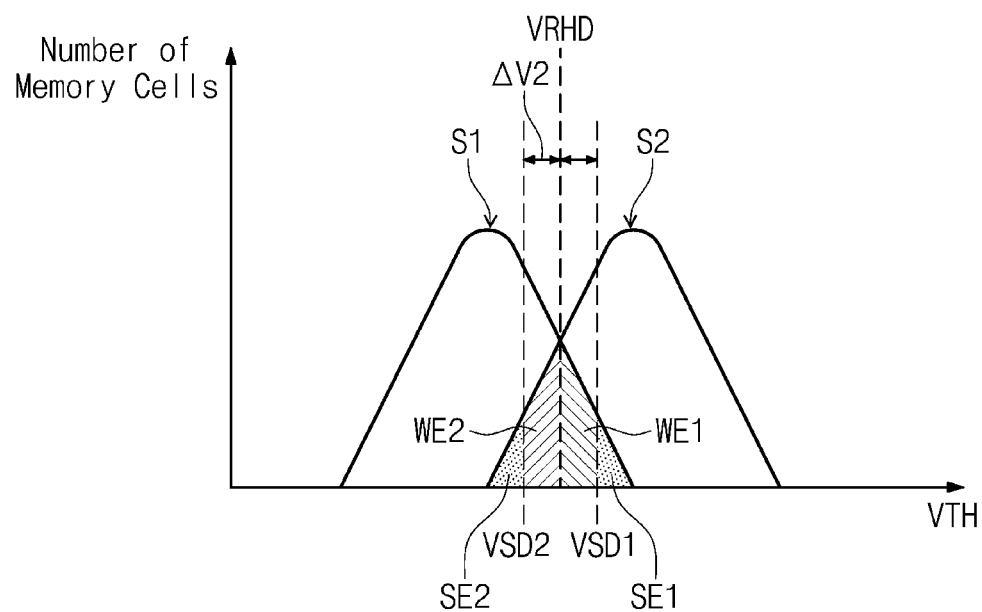
FIG. 9 illustrates an example of performing second read operations on each of the nonvolatile memory devices according to example embodiments.

FIG. 9 illustrates an example of performing second read operations on each of the nonvolatile memory devices 11 according to example embodiments. Referring to FIGS. 1, 7, 8, and 9, the second read operations may include a read operation using a hard decision read level VRHD calculated between two adjacent states, read operations that are performed while increasing a read level from the hard decision read level VRHD, and read operations that are performed while decreasing a read level from the hard decision read level VRHD.

For example, the hard decision read level VRHD may correspond to a level of the valley "V" calculated through the first read operations. The read operations that are performed while increasing a read level from the hard decision read level VRHD and the read operations that are performed while decreasing a read level from the hard decision read level VRHD may be performed until read levels satisfying the SER, for example, a first soft decision read level VSD1 and a second soft decision read level VSD2 are detected. The SER is calculated by Equation 1 below.

$$SER=(SE1+SE2)/(SE1+SE2+WE1+WE2) \quad \text{[Equation 1]}$$

In Equation 1 above, "SE1" indicates the number of memory cells (corresponding to a strong error), which are determined as a second state S2 when read by using the hard decision read level VRHD and as the second state S2 even when read by using the first soft decision read level VSD1, from among memory cells programmed to a first state S1 (e.g., the sixth program state P6).

In Equation 1 above, "SE2" indicates the number of memory cells (corresponding to a strong error), which are determined as the first state S1 when read by using the hard decision read level VRHD and as the first state S1 even when read by using the second soft decision read level VSD2, from among memory cells programmed to the second state S2 (e.g., the seventh program state P7).

In Equation 1 above, "WE1" indicates the number of memory cells (corresponding to a weak error), which are determined as the second state S2 when read by using the hard decision read level VRHD and as the first state S1 when read by using the first soft decision read level VSD1, from among the memory cells programmed to the first state S1 (e.g., the sixth program state P6).

In Equation 1 above, "WE2" indicates the number of memory cells (corresponding to a weak error), which are determined as the first state S1 when read by using the hard decision read level VRHD and as the second state S2 when read by using the second soft decision read level VSD2, from among the memory cells programmed to the second state S2 (e.g., the seventh program state P7).

The computing device 100 may perform the second read operations on each of the nonvolatile memory devices 11 until the first soft decision read level VSD1 and the second soft decision read level VSD2 satisfying the SER determined by the computing device 100 are detected. When the determined SER is satisfied, the computing device 100 may determine a difference between the hard decision read level VRHD and the first soft decision read level VSD1, a difference between the hard decision read level VRHD and the second soft decision read level VSD2, all the differences, or an intermediate value (or average value) of all the differences, as a second offset(s). For example, the second offset may represent as ΔV2.

Figure 10:
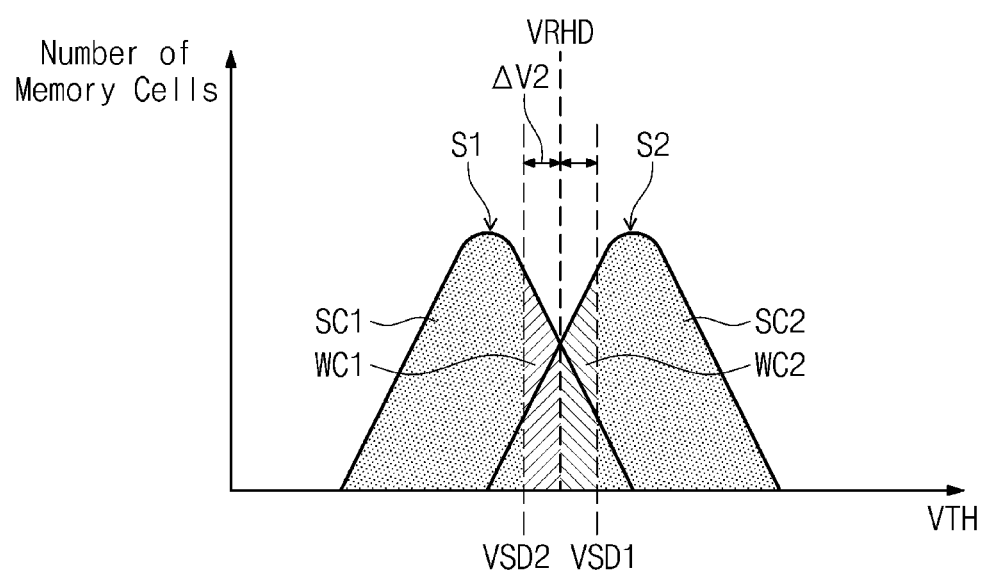
FIG. 10 illustrates another example of performing second read operations on each of nonvolatile memory devices according to example embodiments.

FIG. 10 illustrates another example of performing second read operations on each of the nonvolatile memory devices according to example embodiments. Referring to FIGS. 1, 7, 8, and 10, the second read operations may include a read operation using a hard decision read level VRHD calculated between two adjacent states, read operations that are performed while increasing a read level from the hard decision read level VRHD, and read operations that are performed while decreasing a read level from the hard decision read level VRHD.

For example, the hard decision read level VRHD may correspond to a level of the valley "V" calculated through the first read operations. The read operations that are performed while increasing a read level from the hard decision read level VRHD and the read operations that are performed while decreasing a read level from the hard decision read level VRHD may be performed until read levels satisfying the SCR, for example, the first soft decision read level VSD1 and the second soft decision read level VSD2 are detected. The SCR is calculated by Equation 2 below.

$$SCR=(SC1+SC2)/(SC1+SC2+WC1+WC2) \quad \text{[Equation 2]}$$

In Equation 2 above, "SC1" indicates the number of memory cells (corresponding to strong correct), which are determined as a first state S1 when read by using the hard decision read level VRHD and as the first state S1 even when read by using the second soft decision read level VSD2, from among memory cells programmed to the first state S1 (e.g., the sixth program state P6).

In Equation 2 above, "SC2" indicates the number of memory cells (corresponding to strong correct), which are determined as a second state S2 when read by using the hard decision read level VRHD and as the second state S2 even when read by using the first soft decision read level VSD1, from among memory cells programmed to the second state S2 (e.g., the seventh program state P7).

In Equation 2 above, "WC1" indicates the number of memory cells (corresponding to weak correct), which are determined as the first state S1 when read by using the hard decision read level VRHD and as the second state S2 when read by using the second soft decision read level VSD2, from among the memory cells programmed to the first state S1 (e.g., the sixth program state P6).

In Equation 2 above, "WC2" indicates the number of memory cells (corresponding to weak correct), which are determined as the second state S2 when read by using the hard decision read level VRHD and as the first state S1 when read by using the first soft decision read level VSD1, from among the memory cells programmed to the second state S2 (e.g., the seventh program state P7).

The computing device 100 may perform the second read operations on each of the nonvolatile memory devices 11 until the first soft decision read level VSD1 and the second soft decision read level VSD2 satisfying the SCR determined by the computing device 100 are detected. When the determined SCR is satisfied, the computing device 100 may determine a difference between the hard decision read level VRHD and the first soft decision read level VSD1, a difference between the hard decision read level VRHD and the second soft decision read level VSD2, all the differences, or an intermediate value (or average value) of all the differences, as a second offset(s).

In an embodiment, the computing device 100 may select both a value of the SER and a value of the SCR and may calculate second offsets from soft decision read levels satisfying the SER value and the SCR value. The computing device 100 may determine an intermediate value, an average value, etc. of the second offsets satisfying the SER value and the second offsets satisfying the SCR value, as final second offsets.

For another example, the computing device 100 may select only one of a value of the SER and a value of the SCR and may calculate second offsets from soft decision read levels satisfying the selected SER value or the selected SCR value.

When a second offset is calculated, the computing device 100 may store data which associate physical features (e.g., including an address, a data storage characteristic, etc.) to the second offset as a portion of a dataset in the database 12.

Figure 11:
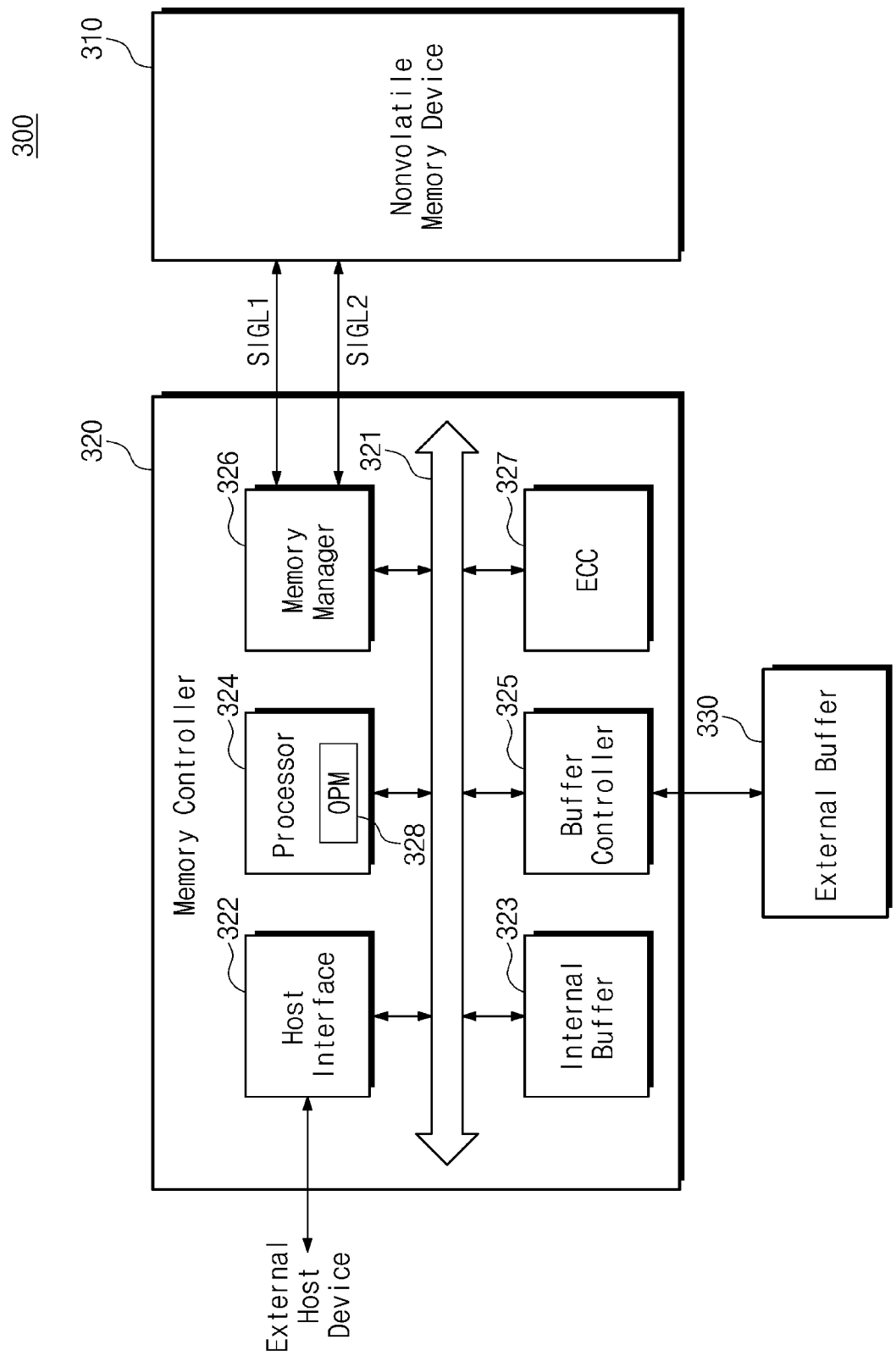
FIG. 11 illustrates a storage device according to an embodiment of the present disclosure.

FIG. 11 illustrates a storage device 300 according to an embodiment of the present disclosure. Referring to FIG. 11, the storage device 300 may include a nonvolatile memory device 310, a memory controller 320, and an external buffer 330. The nonvolatile memory device 310 may include a plurality of memory cells. Each of the plurality of memory cells may store two or more bits.

For example, the nonvolatile memory device 310 may include at least one of various nonvolatile memory devices such as a flash memory device, a phase change memory device, a ferroelectric memory device, a magnetic memory device, and a resistive memory device. The nonvolatile memory device 310 may include the nonvolatile memory device 200 described with reference to FIGS. 3 to 5.

The memory controller 320 may receive various requests for writing data in the nonvolatile memory device 310 or reading data from the nonvolatile memory device 310 from an external host device. The memory controller 320 may store (or buffer) user data communicated with the external host device to the external buffer 330 and may store meta data for managing the storage device 300 to the external buffer 330.

The memory controller 320 may access the nonvolatile memory device 310 through first signal lines SIGL1 and second signal lines SIGL2. For example, the memory controller 320 may send a command and an address to the nonvolatile memory device 310 through the first signal lines SIGL1. The memory controller 320 may exchange data with the nonvolatile memory device 310 through the first signal lines SIGL1.

The memory controller 320 may exchange control signals with the nonvolatile memory device 310 through the second signal lines SIGL2.

In an embodiment, the memory controller 320 may be configured to control two or more nonvolatile memory devices. The memory controller 320 may provide first signal lines and second signal lines for each of the two or more nonvolatile memory devices.

For another example, the memory controller 320 may provide first signal lines so as to be shared by the two or more nonvolatile memory devices. The memory controller 320 may provide a part of second signal lines so as to be shared by the two or more nonvolatile memory devices and may separately provide the remaining part thereof.

The external buffer 330 may include a random access memory. For example, the external buffer 330 may include at least one of a DRAM, a PRAM, a FRAM, a MRAM, and a RRAM.

The memory controller 320 may include a bus 321, a host interface 322, an internal buffer 323, a processor 324, a buffer controller 325, a memory manager 326, and an error correction code (ECC) block 327.

The bus 321 may provide communication channels between the components in the memory controller 320. The host interface 322 may receive various requests from the external host device and may parse the received requests. The host interface 322 may store the parsed requests in the internal buffer 323.

The host interface 322 may send various responses to the external host device. The host interface 322 may exchange signals with the external host device in compliance with a given communication protocol. The internal buffer 323 may include a RAM. For example, the internal buffer 323 may include a SRAM or a DRAM.

The processor 324 may drive an operating system or firmware for driving the memory controller 320. The processor 324 may read the parsed requests stored in the internal buffer 323 and may generate commands and addresses for controlling the nonvolatile memory device 310. The processor 324 may provide the generated commands and addresses to the memory manager 326.

The processor 324 may store various meta data for managing the storage device 300 in the internal buffer 323. The processor 324 may access the external buffer 330 through the buffer controller 325. The processor 324 may control the buffer controller 325 and the memory manager 326 such that user data stored in the external buffer 330 are provided to the nonvolatile memory device 310.

The processor 324 may control the host interface 322 and the buffer controller 325 such that the data stored in the external buffer 330 are provided to the external host device. The processor 324 may control the buffer controller 325 and the memory manager 326 such that data received from the nonvolatile memory device 310 are stored in the external buffer 330. The processor 324 may control the host interface 322 and the buffer controller 325 such that data received from the external host device are stored in the external buffer 330.

Under control of the processor 324, the buffer controller 325 may write data in the external buffer 330 or may read data from the external buffer 330. The memory manager 326 may communicate with the nonvolatile memory device 310 through the first signal lines SIGL1 and the second signal lines SIGL2 under control of the processor 324.

The memory manager 326 may access the nonvolatile memory device 310 under control of the processor 324. For example, the memory manager 326 may access the nonvolatile memory device 310 through the first signal lines SIGL1 and the second signal lines SIGL2. The memory manager 326 may communicate with the nonvolatile memory device 310, based on a protocol that is defined in compliance with the standard or is defined by a manufacturer.

The ECC block 327 may perform error correction encoding on data to be provided to the nonvolatile memory device 310 by using an error correction code ECC. The ECC block 327 may perform error correction decoding on data received from the nonvolatile memory device 310 by using the error correction code ECC.

In an embodiment, the storage device 300 may not include the external buffer 330 and the buffer controller 325. When the external buffer 330 and the buffer controller 325 are not included in the storage device 300, the above functions of the external buffer 330 and the buffer controller 325 may be performed by the internal buffer 323.

The processor 324 may include an offset prediction module (OPM) 328. The OPM 328 may be learned based on a dataset obtained from the computing device 100 of FIG. 1. The OPM 328 may be learned based on the random forest, the multi-layer perception, or the linear regression. In response to that physical features are received, the OPM 328 may be learned to predict offset information indicating a second offset. Herein, the storage device 300 may correspond to the storage device 170 of FIG. 1.

Figure 12:
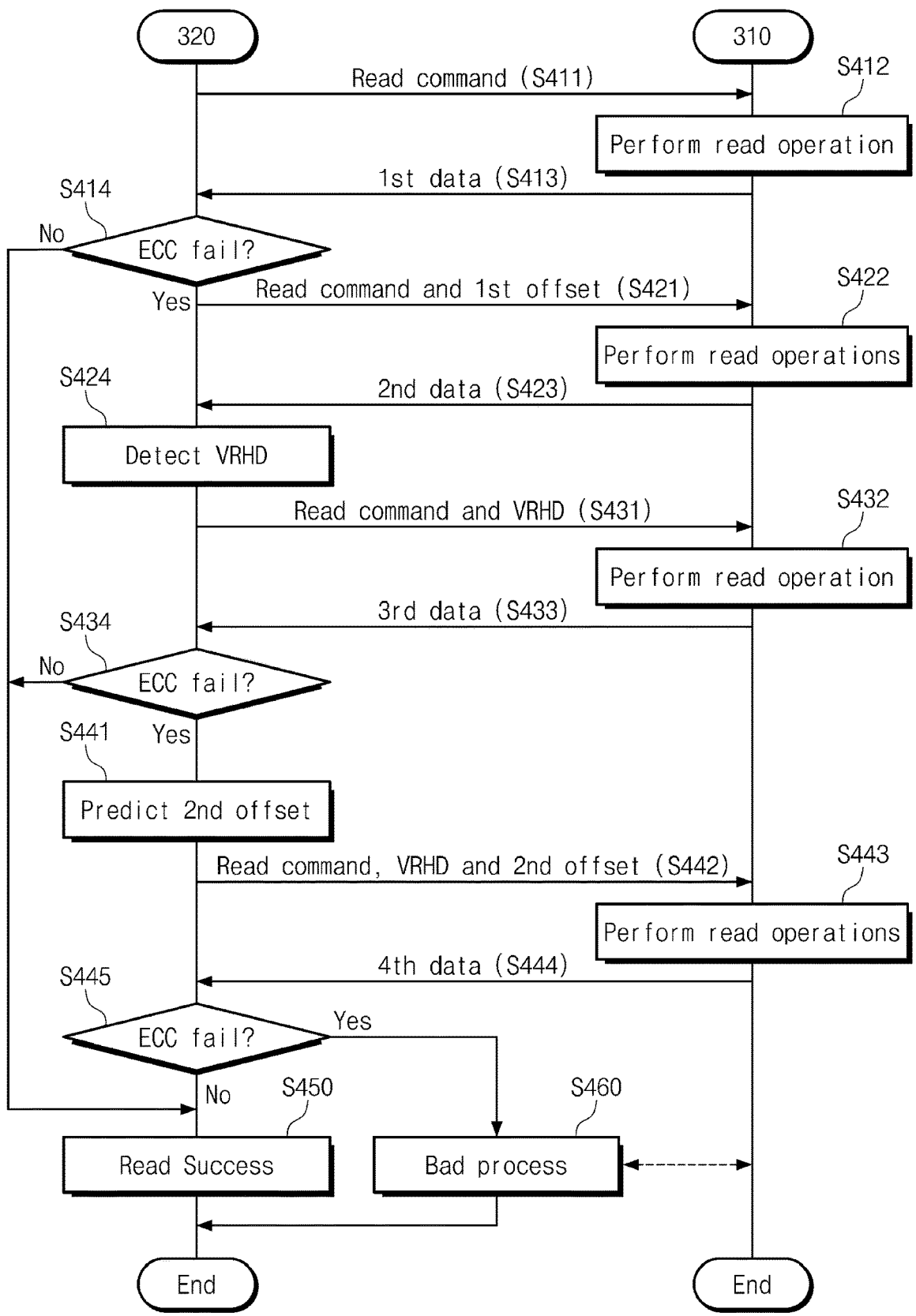
FIG. 12 illustrates an example in which a storage device performs a read operation according to example embodiments.

FIG. 12 illustrates an example in which the storage device 300 performs a read operation according to example embodiments. Referring to FIGS. 11 and 12, operation S411 to operation S414 may correspond to a first-step read operation. Referring to the first-step read operation, in operation S411, the memory controller 320 may send a read command to the nonvolatile memory device 310. For example, the memory controller 320 may send the read command to the nonvolatile memory device 310 depending on a request of an external host device or an internally designated schedule.

In response to the read command, in operation S412, the nonvolatile memory 310 may perform the read operation. For example, the nonvolatile memory device 310 may perform the read operation based on standard read levels VR. In operation S413, the nonvolatile memory device 310 may send first data as a result of the read operation to the memory controller 320.

In operation S414, the memory controller 320 may perform error correction decoding based on the error correction code block 327. When an error of the first data is corrected by the error correction decoding, that is, when a failure of the error correction code ECC does not occur, in operation S450, the memory controller 320 may determine that the read operation is successful.

When an error of the first data is not corrected by the error correction decoding, that is, when a failure of the error correction code ECC occurs, a second-step read operation of operation S421 to operation S424 may be performed. Referring to the second-step read operation, in operation S421, the memory controller 320 may send the read command and information of a first offset to the nonvolatile memory device 310. The first offset may correspond to the first offset described with reference to FIG. 8. The first offset may be an offset for searching the valley "V".

In response to the read command and the information of the first offset, in operation S422, the nonvolatile memory device 310 may perform read operations. For example, the nonvolatile memory device 310 may perform the read operations based on a standard read level(s) VR, a read level(s) higher than the standard read level(s) as much as the first offset, and a read level(s) lower than the standard read level(s) as much as the first offset.

In operation S423, the nonvolatile memory device 310 may send second data as a result of the read operations to the memory controller 320. In operation S424, the memory controller 320 may detect the hard decision read level(s) VRHD based on the second data.

In response to that the hard decision read level(s) VRHD is detected, a third-step read operation of operation S431 to operation S434 may be performed. Referring to the third-step read operation, in operation S431, the memory controller 320 may send the read command and information of the hard-decision read level(s) VRHD to the nonvolatile memory device 310. For example, the memory controller 320 may send the read command to the nonvolatile memory device 310 depending on a request of an external host device or an internally designated schedule.

For example, the information of the hard-decision read level(s) VRHD may be provided to the nonvolatile memory device 310 in the form of an offset(s) associated with the standard read level(s) VR. The nonvolatile memory device 310 may detect the hard decision read level(s) VRHD from the standard read levels VR, based on the offset(s).

In response to the read command and the information of the hard decision read level(s) VRHD, in operation S432, the nonvolatile memory device 310 may perform a read operation. For example, the nonvolatile memory device 310 may perform read operations based on the hard decision read levels VRHD. In operation S433, the nonvolatile memory device 310 may send third data as a result of the read operations to the memory controller 320.

In operation S434, the memory controller 320 may perform error correction decoding based on the error correction code block 327. When an error of the third data is corrected by the error correction decoding, that is, when a failure of the error correction code ECC does not occur, in operation S450, the memory controller 320 may determine that the read operation is successful.

When an error of the third data is not corrected by the error correction decoding, that is, when a failure of the error correction code ECC occurs, a fourth-step read operation of operation S441 to operation S445 may be performed. Referring to the fourth-step read operation, in operation S441, the memory controller 320 may predict a second offset from the offset prediction module 328, based on physical features including an address, region values detected in the second-step read operation, and a data storage characteristic of memory cells to be read.

In operation S442, the memory controller 320 may send, to the nonvolatile memory device 310, the read command, information of the hard decision read level(s) VRHD, and information of the second offset. For example, the information of the hard-decision read level(s) VRHD may be provided to the nonvolatile memory device 310 in the form of an offset(s) associated with the standard read level(s) VR. The nonvolatile memory device 310 may detect the hard decision read level(s) VRHD from the standard read levels VR, based on the offset(s). The second offset may correspond to the second offset described with reference to FIGS. 9 and 10. The second offset may be an offset satisfying a given SER or SCR.

In operation S443, the nonvolatile memory device 310 may perform read operations based on the read command, information of the hard decision read level(s) VRHD, and the information of the second offset. For example, the nonvolatile memory device 310 may perform the read operations based on the hard decision read levels VRHD, read levels higher than the hard decision read levels VRHD as much as the second offset, and read levels lower than the hard decision read levels VRHD as much as the second offset.

In operation S444, the nonvolatile memory device 310 may send fourth data as a result of the read operations to the memory controller 320. In operation S445, the memory controller 320 may perform error correction decoding based on the error correction code block 327.

In an embodiment, the error correction decoding may be based on soft decision. The error correction decoding may be based on low density parity check (LDPC). A likelihood ratio or likelihood may be given to results of read operations by using the hard decision read levels VRHD, results of read operations by using the read levels higher than the hard decision read levels VRHD as much as the second offset, and results of read operations by using the read levels lower than the hard decision read levels VRHD as much as the second offset.

Error correction decoding may be performed by repeating the transmission of a message from a check node to a variable node and the transmission of a message from the check node to the variable node, based on the likelihood ratio or likelihood. When an error of the fourth data is corrected by the error correction decoding, that is, when a failure of the error correction code ECC does not occur, in operation S450, the memory controller 320 may determine that the read operation is successful.

When an error of the fourth data is not corrected by the error correction decoding, that is, when a failure of the error correction code ECC occurs, in operation S460, the memory controller 320 may perform a bad process with the nonvolatile memory device 310. For example, the memory controller 320 may process a memory block being a read target as a bad block.

When the read operation is succeed or when the bad process is completed, the read operation of the nonvolatile memory device 310 and the memory controller 320 may be terminated. In an embodiment, the third-step read operation may be omitted. For example, in response to that the hard decision read level VRHD is detected, the fourth-step read operation may be performed.

Figure 13:
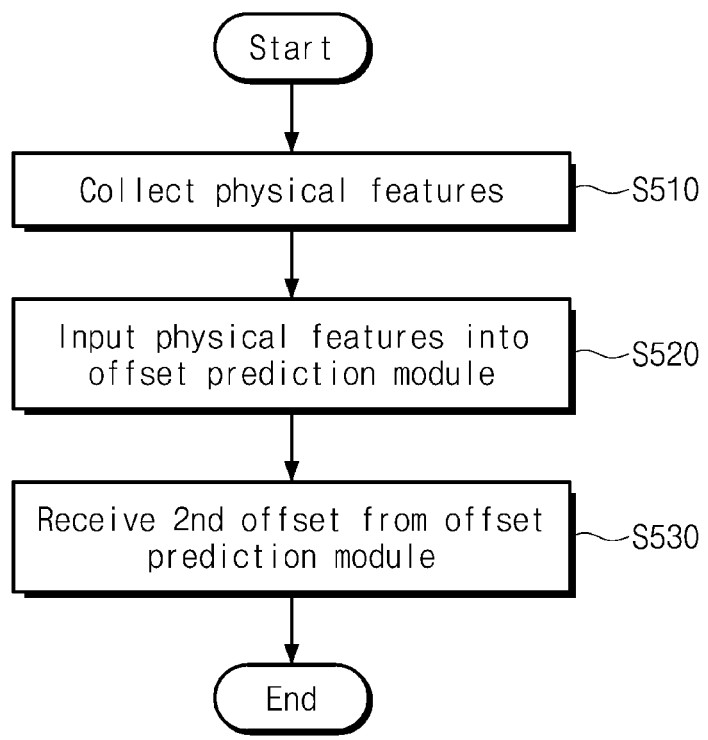
FIG. 13 illustrates an example in which a memory controller predicts a second offset based on physical features according to example embodiments.

FIG. 13 illustrates an example in which the memory controller 320 predicts a second offset based on physical features according to example embodiments. Referring to FIGS. 11 and 13, in operation S510, the memory controller 320 may collect physical features. The physical features may include an address, region values collected in the second-step read operation, and a data storage characteristic of memory cells to be read.

In operation S520, the memory controller 320 may input the collected physical features to the offset prediction module 328. For example, the offset prediction module 328 may be executed by a separate acceleration processor that accelerates machine learning-based computation/calculation.

In operation S530, the memory controller 320 may receive the second offset corresponding to the physical features from the offset prediction module 328.

As described above, the storage device 300 according to an embodiment of the present disclosure may predict read levels necessary for soft decision by using a machine learning-based offset prediction module. Accordingly, a time necessary to perform soft decision may decrease. Also, because optimal read levels for soft decision are obtained, the reliability of soft decision may be improved.

Figure 14:
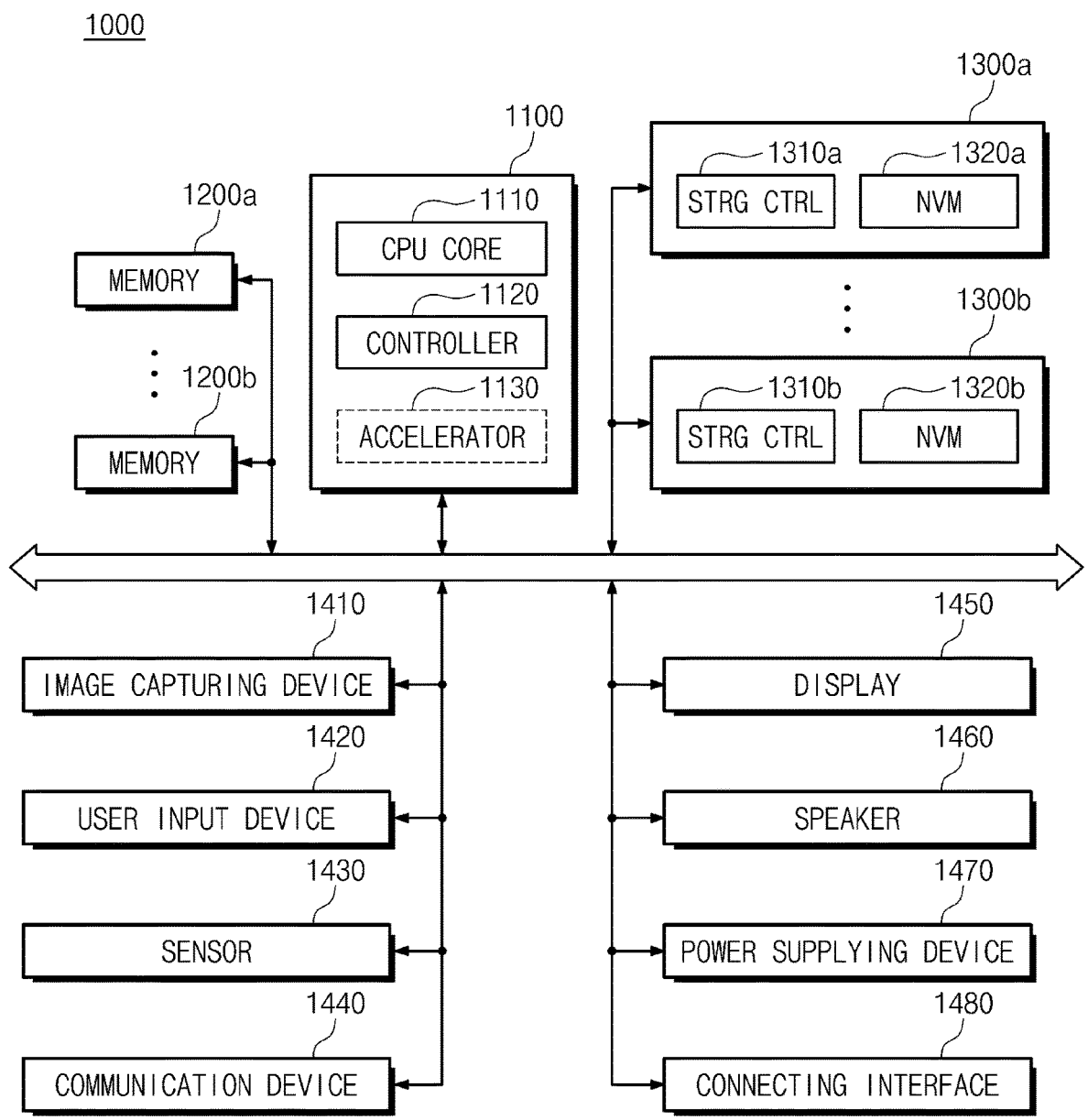
FIG. 14 is a diagram illustrating an electronic device to which a storage device according to an embodiment of the present disclosure is applied.

FIG. 14 is a diagram of a system 1000 to which a storage device is applied, according to an embodiment. The system 1000 of FIG. 14 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 14 is not necessarily limited to the mobile system and may be a PC, a laptop computer, a server, a media player, or an automotive device (e.g., a navigation device).

Referring to FIG. 14, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as a SRAM and/or a DRAM, each of the memories 1200a and 1200b may include a non-volatile memory, such as a flash memory, a PRAM and/or a RRAM. The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an embodiment, each of the storage devices 1300a and 1300b may correspond to the storage device 300 described with reference to FIGS. 11 to 13. Each of the storage controllers (STRG CTRL) 1310a and 1310b may correspond to the memory controller 320 described with reference to FIGS. 11 to 13. Each of the nonvolatile memory devices 1320a and 1320b may include the nonvolatile memory device 310 described with reference to FIGS. 11 to 13.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, information of an offset(s) used to determine read levels of read operations for error correction may be predicted based on machine learning. Accordingly, a storage device including a nonvolatile memory device performing error correction at an improved speed and improving reliability, an operating method of the storage device, and an operating method of an electronic device including the nonvolatile memory device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. An operating method of a storage device which includes a nonvolatile memory device and a memory controller, the method comprising:
   ① sending, at the memory controller, a first read command and first offset information to the nonvolatile memory device;
   ② performing, at the nonvolatile memory device, first read operations based on the first read command and the first offset information;
   ③ sending, at the nonvolatile memory device, a result of the first read operations as first data to the memory controller;
   ④ sending, at the memory controller, a second read command, read voltage levels, and second offset information to the nonvolatile memory device;
   ⑤ performing, at the nonvolatile memory device, second read operations based on the second read command, the read voltage levels, and the second offset information;
   ⑥ sending, at the nonvolatile memory device, results of the second read operations as second data to the memory controller; and
   ⑦ predicting the second set information, based on the result of the first read operations and a machine learning-based offset prediction module included in the memory controller.

2. The method of claim 1, wherein the performing of the first read operations includes:
   performing a read operation by using a first read voltage level;
   performing a read operation by using a second read voltage level higher than the first read voltage level as much as the first offset information; and
   performing a read operation by using a third read voltage level lower than the first read voltage level as much as the first offset information.

3. The method of claim 1, wherein the performing of the second read operations includes:
   performing a read operation by using a first read voltage level of the read voltage levels;
   performing a read operation by using a second read voltage level higher than the first read voltage level as much as the second offset information; and
   performing a read operation by using a third read voltage level lower than the first read voltage level as much as the second offset information.

4. The method of claim 1, further comprising:
   sending, at the memory controller, a third read command to the nonvolatile memory device;
   performing, at the nonvolatile memory device, a third read operation in response to the third read command; and
   sending, at the nonvolatile memory device, a result of the third read operation as third data to the memory controller.

5. The method of claim 4, further comprising:
   performing error correction decoding on the third data,
   wherein when the performing of the error correction decoding on the third data is failed, the operations ① through ⑥ are performed.

6. The method of claim 1, further comprising:
   sending, at the memory controller, a third read command and a first read voltage level to the nonvolatile memory device;
   performing, at the nonvolatile memory device, a third read operation in response to the third read command and the first read voltage level; and
   sending, at the nonvolatile memory device, a result of the third read operation as third data to the memory controller.

7. The method of claim 6, further comprising:
   performing error correction decoding on the third data,
   wherein when the performing of the error correction decoding on the third data is failed, the operations ④ through ⑥ are performed.

8. The method of claim 1, further comprising:
   performing error correction decoding on the second data,
   wherein the performing of the error correction decoding on the second data is based on low density parity check (LDPC).

9. The method of claim 1, wherein the predicting of the second offset information includes:
   inputting, to the machine learning-based offset prediction module, at least one of the read voltage levels, an address of the nonvolatile memory device associated with the first read operations, the number of program and erase cycles of memory cells where the first read operations are performed, and the number of memory cells of the nonvolatile memory device associated with the first offset information; and
   outputting the second offset information from the machine learning-based offset prediction module.

10. The method of claim 1, wherein the predicting of the second offset information by the machine learning-based offset prediction module is performed based on at least one of random forest, multi-layer perception, and linear regression.

11. The method of claim 1, further comprising:
generating the read voltage levels based on the first data.

12. A storage device comprising:
a nonvolatile memory device including a plurality of memory cells; and
a memory controller configured to:
send a first read command and first offset information to the nonvolatile memory device;
receive first data from the nonvolatile memory device in response to the first read command and the first offset information;
generate read voltage levels based on the first data;
send a second read command, the read voltage levels, and second offset information to the nonvolatile memory device; and
receive second data from the nonvolatile memory device in response to the second read command, the read voltage levels, and the second offset information, and
wherein the memory controller includes a machine learning-based offset prediction module, and
wherein the machine learning-based offset prediction module predicts the second offset information based on at least one of an address associated with the first data and the first read command, and the number of program and erase cycles of memory cells associated with the address.

13. The storage device of claim 12, wherein the memory controller is further configured to:
send a third read command to the nonvolatile memory device;
receive third data from the nonvolatile memory device in response to the third read command; and
perform error correction decoding on the third data, and
wherein the memory controller is configured to send the first read command and the first offset information to the nonvolatile memory device in response to failure of the error correction decoding.

14. The storage device of claim 13, wherein the memory controller is configured to send the third read command to the nonvolatile memory device in response to a read request from an external host device.

15. The storage device of claim 12, wherein the memory controller is further configured to:
send a third read command and a first read voltage level to the nonvolatile memory device;
receive third data from the nonvolatile memory device in response to the third read command and the first read voltage level; and
perform error correction decoding on the third data, and
wherein the memory controller is configured to send the second read command, the first read voltage level, and the second offset information to the nonvolatile memory device in response to failure of the error correction decoding.

16. The storage device of claim 12, wherein the machine learning-based offset prediction module is learned based on at least one of random forest, multi-layer perception, and linear regression.

* * * * *